US 6,716,668 B2

(12) United States Patent  
Hayami

(10) Patent No.: US 6,716,668 B2
(45) Date of Patent: *Apr. 6, 2004

(54) METHOD FOR FORMING SEMICONDUCTOR DEVICE

(75) Inventor: Keiko Hayami, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/143,910

(22) Filed: May 14, 2002

(65) Prior Publication Data

US 2002/0137259 A1 Sep. 26, 2002

Related U.S. Application Data

(62) Division of application No. 09/522,921, filed on Mar. 10, 2000, now Pat. No. 6,399,414.

(30) Foreign Application Priority Data

Sep. 10, 1999 (JP) ............................................ 11-257637

(51) Int. Cl.[7] ............................................... H01L 21/48
(52) U.S. Cl. ....................... 438/106; 438/123; 438/120; 438/107
(58) Field of Search ................................. 438/106, 120, 438/123, 121, 107, 187

(56) References Cited

U.S. PATENT DOCUMENTS

| 4,891,491 A | 1/1990 | Duley et al. |
| 5,393,705 A | 2/1995 | Sonobe |
| 5,639,694 A | 6/1997 | Diffenderfer et al. |
| 5,696,029 A | 12/1997 | Alvarez et al. |
| 5,869,355 A | 2/1999 | Fukaya |
| 6,225,146 B1 | 5/2001 | Yamaguchi et al. |
| 6,399,414 B1 * | 6/2002 | Hayami ..................... 438/106 |

FOREIGN PATENT DOCUMENTS

| JP | 2114539 | 4/1990 |
| JP | 4144298 | 5/1992 |
| JP | 58165347 A | 9/1993 |

* cited by examiner

Primary Examiner—Matthew Smith
Assistant Examiner—Renzo N Rocchegiani
(74) Attorney, Agent, or Firm—Volentine Francos, PLLC

(57) ABSTRACT

A method for forming a semiconductor device includes providing a lead frame which has a die pad and a plurality of leads extending toward the outside of the die pad, mounting a semiconductor chip on the die pad, defining a plurality of inner leads by cutting a predetermined cut portion on each of the leads located around the semiconductor chip, and bonding a wire between the inner leads and the semiconductor chip. Accordingly, an applicable lead frame is provided for several sizes of a semiconductor chip.

20 Claims, 4 Drawing Sheets

METHOD FOR FORMING SEMICONDUCTOR DEVICE

CROSS REFERENCE TO RELATED APPLICATIONS

This is a divisional application of application Ser. No. 09/522,921, filed Mar. 10, 2000 now U.S. Pat. No. 6,399,414, which is hereby incorporated by reference in its entirety for all purposes.

BACKGROUND OF THE INVENTION

1. Field of the Invention

The present invention generally relates to a semiconductor module, and more particularly, the present invention relates to a pattern shape for a contacting portion formed on a printed wiring board.

This application is a counterpart of Japanese application Serial Number 257637/1999, filed Sep. 10, 1999, the subject matter of which is incorporated herein by reference.

2. Description of the Related Art

In a conventional art, a lead frame is designed as having a die pad based on a size of a semiconductor chip and an inner lead in consideration of a wire length and the number of pins.

It is desired to provide an applicable lead frame for several sizes of a semiconductor chip.

SUMMARY OF THE INVENTION

An object of the present invention is to provide a method for forming a semiconductor device that can provide an applicable lead frame for several sizes of a semiconductor chip.

According to one aspect of the present invention, for achieving the above object, there is provided a method for forming a semiconductor device that includes providing a lead frame which has a die pad and a plurality of leads extending toward outside from the die pad, mounting a semiconductor chip on the die pad, defining a plurality of inner leads by cutting a predetermined cut portion on each of the leads located around the semiconductor chip, and bonding a wire between each of inner leads and the semiconductor chip.

BRIEF DESCRIPTION OF THE DRAWINGS

While the specification concludes with claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A method for forming a semiconductor device according to a first preferred embodiment of the present invention will hereinafter be described in detail with reference to the accompanying drawings.

FIGS. 1A–1D are plane views showing a method for forming a semiconductor device according to a first preferred embodiment of the present invention.

Figure 1A:
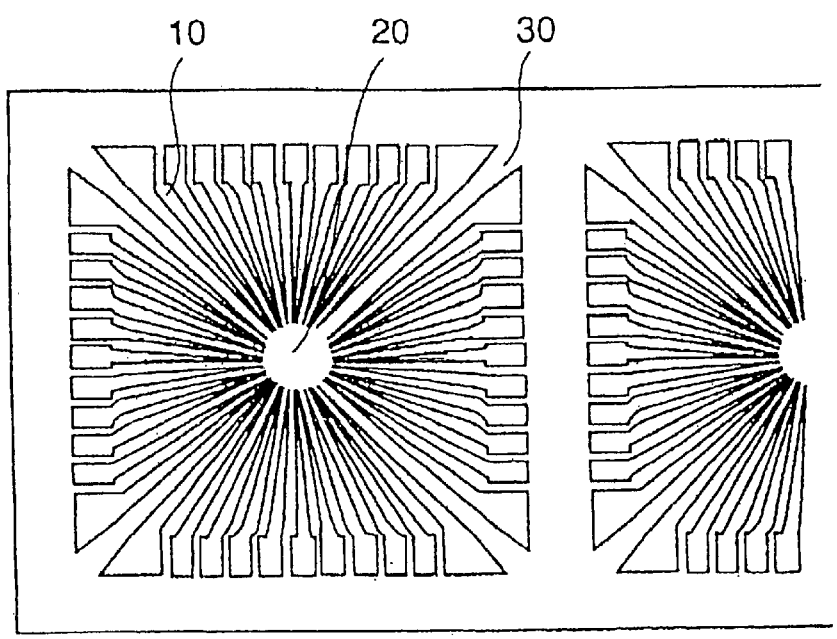
FIG. 1A–FIG. 1D are plane views showing a method for forming a semiconductor device according to a first preferred embodiment of the present invention.

As shown in FIG. 1A, a lead frame 200 is preferably made up of a die pad 20, a plurality of leads 10, and a plurality of support bars 30. The plurality of leads 10 and the plurality of support bars 30 become one with the die pad 20. The plurality of leads 10 and the plurality of support bars 30 extend toward outside from the die pad 20. Therefore, before forming a plurality of inner leads, the plurality of leads 10 have become one with the die pad 20.

Figure 1B:
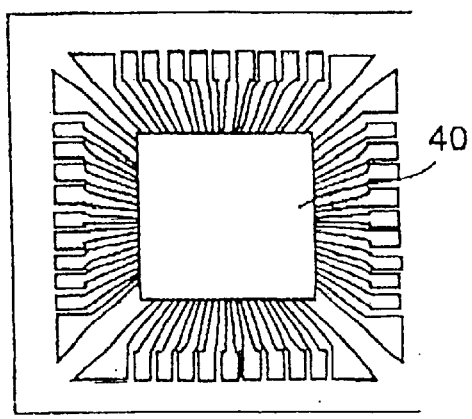

As shown in FIG. 1B, a semiconductor chip 40 is mounted on the die pad 20, by so-called die bonding.

Figure 1C:
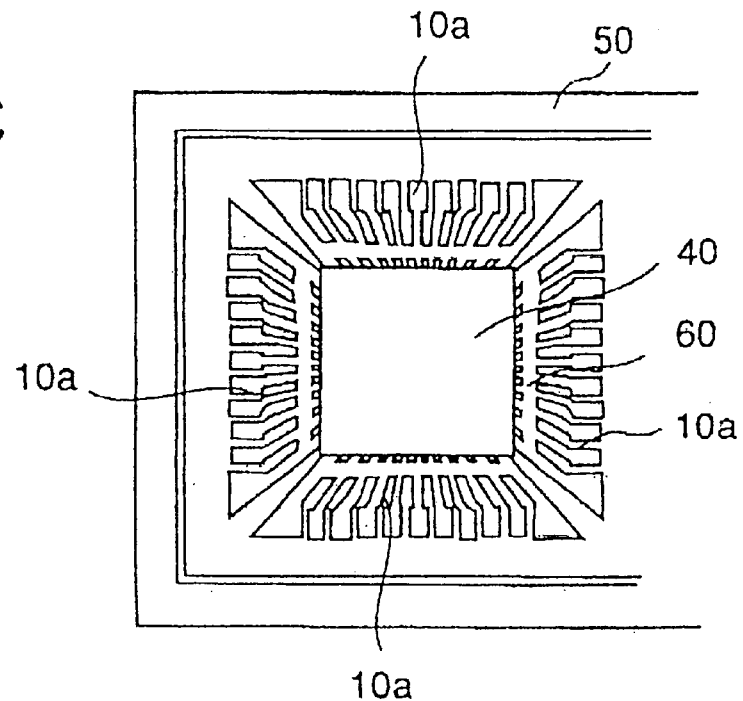

As shown in FIG. 1C, the lead frame 200 having the semiconductor chip 40 mounted thereon is transferred to a stage 50 of a wire bonding apparatus (not shown). Next, the plurality of leads 10 are cut around the semiconductor chip 40 in consideration of the size of the semiconductor chip 40. Therefore, a plurality of inner leads 10a are formed by cutting a predetermined cut portion on each of the leads 10 located around the semiconductor chip 40.

Figure 1D:
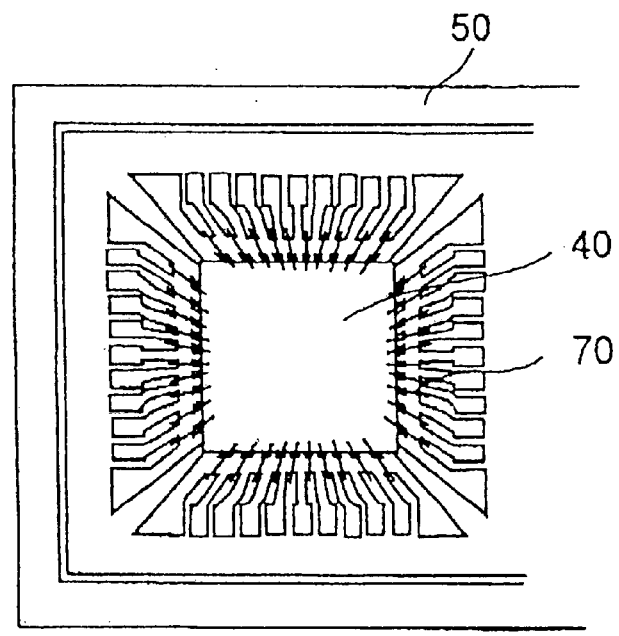

As shown in FIG. 1D, a plurality of electrodes (not shown) on the semiconductor chip 40 are electrically connected to the respective inner leads 10a with respective bonding wires 70.

As mentioned above, in the first preferred embodiment of the present invention, the plurality of inner leads 10a are formed by cutting the predetermined cut portion on the each of the leads 10 located around the semiconductor chip 40, after the semiconductor chip 40 is mounted on the die pad 20. Accordingly, the first preferred embodiment of the present invention provides an applicable lead frame for semiconductor chips of several sizes. Further, at the time that the semiconductor chip 40 is transferred to stage 50 of a wire bonding apparatus, each of the leads 10 remain attached to the die pad 20. Therefore, the respective inner leads 10a are not formed yet at this particular time. Accordingly, the first preferred embodiment of the present invention prevents undesired transformation or dispersion of the inner leads.

Figure 2A:
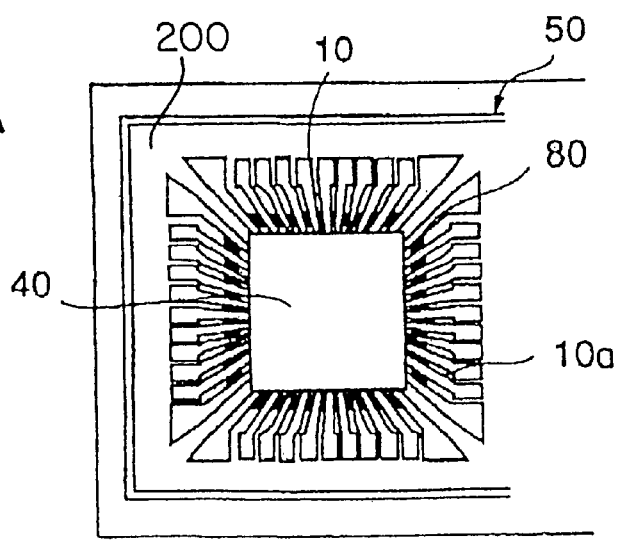
FIG. 2A–FIG. 2C are a plane view and cross-sectional views showing a method for forming a semiconductor device according to a second preferred embodiment of the present invention.
Figure 2B:
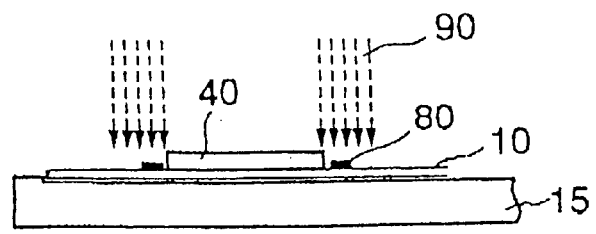
Figure 2C:
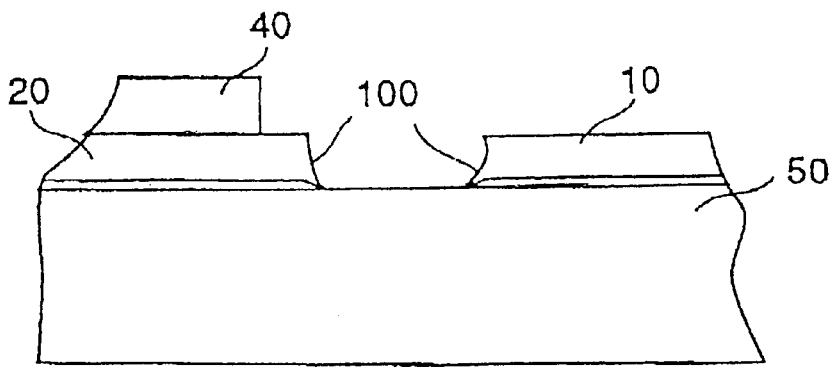

FIGS. 2A–2C are a plane view and cross-sectional views showing a method for forming a semiconductor device according to a second preferred embodiment of the present invention.

As shown in FIG. 2A, the plurality of leads 10 are cut around the semiconductor chip 40 in consideration of the size of the semiconductor chip 40. Therefore, a plurality of inner leads 10a are formed by cutting a predetermined cut portion on each of the leads 10 located around the semiconductor chip 40.

Concretely, the semiconductor chip 40 is mounted on the die pad 20. Next, the lead frame 200 having the semiconductor chip 40 mounted thereon is transferred to a stage 50 of a wire bonding apparatus (not shown). At this time, since the semiconductor chip 40 is mounted on the semiconductor chip, a predetermined cut portion on each of the leads 10 is defined. Next, the predetermined cut portions are painted black, as indicated by 80 in FIGS. 2A and 2B.

As shown in FIG. 2B and FIG. 2C, laser light that reacts to black is emitted on the predetermined cut portions. As a result, cut portions 100 are formed. Also, reflectance of the predetermined cut portions can be reduced by spraying an oxygen thereon.

As mentioned above, the second preferred embodiment of the present invention can form the plurality of inner leads 10a together. Accordingly, the second preferred embodiment of the present invention can easily form the plurality of inner leads 10a without using mechanical cutting.

Figure 3:
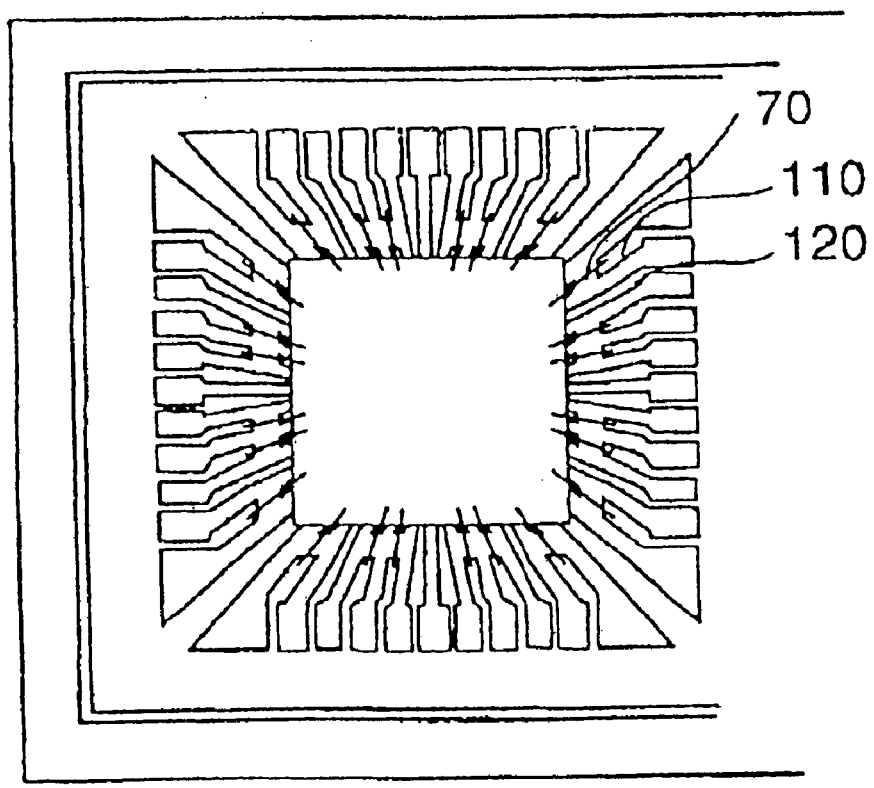
FIG. 3 is a plane view showing a method for forming a semiconductor device according to a third preferred embodiment of the present invention.

FIG. 3 is a plane view showing a method for forming a semiconductor device according to a third preferred embodiment of the present invention.

As shown in FIG. 3, cutting of the leads 120 is performed based on whether or not the leads are to be wire bonded. For example, lead 110 is required to be connected to the chip, and is therefore cut and bonded thereto via wire bonding 70. Accordingly, the third preferred embodiment of the present invention provides an applicable lead frame for several sizes of the semiconductor chip, as in the first and second preferred embodiments.

While the present invention has been described with reference to the illustrative embodiments, this description is not intended to be construed in a limiting sense. Various modifications of the illustrative embodiments, as well as other embodiments of the invention, will be apparent to those skilled in the art with reference to this description. It is therefore contemplated that the appended claims will cover any such modifications or embodiments which fall within the true scope of the invention.

What is claimed is:

1. A method for forming a semiconductor device comprising:
   providing a lead frame which has a die pad, a plurality of leads and a plurality of support bars, wherein first ends of the leads and the support bars are connected to the die pad and extend to outside from the die pad;
   mounting a semiconductor chip on the die pad, the first ends of the leads and the first ends of the support bars;
   defining a plurality of inner leads by cutting predetermined cut portions located on each of the leads around the semiconductor chip by light emitted from a laser; and
   bonding wires between each of the inner leads and the semiconductor chip while supporting the semiconductor chip on the die pad by the support bars.

2. The method according to claim 1, wherein said semiconductor chip is mounted on said die pad so that each corner part of said semiconductor chip is supported by a corresponding one of the support bars.

3. The method according to claim 2, wherein the light from the laser is irradiated from a side of the lead frame on which the semiconductor chip is mounted to the leads.

4. The method according to claim 1, wherein all of said leads are cut for forming said inner leads.

5. The method according to claim 1, wherein some of said leads are cut for forming said inner leads.

6. The method according to claim 1, wherein some of said leads are not cut, and said some of the leads and said support bars provide support for the semiconductor chip during said bonding.

7. The method according to claim 6, wherein the light from the laser is irradiated from a side of the lead frame on which the semiconductor chip is mounted to the leads.

8. The method according to claim 1, wherein said inner leads radiate from around said die pad.

9. The method according to claim 8, wherein the light from the laser is irradiated from a side of the lead frame on which the semiconductor chip is mounted to the leads.

10. The method according to claim 1, wherein the light from the laser is irradiated from a side of the lead frame on which the semiconductor chip is mounted to the leads.

11. A method for forming a semiconductor device comprising:
    providing a lead frame which has a die pad, a plurality of leads and a plurality of support bars, each of the leads and the support bars being connected to the die pad and extending toward outside from the die pad;
    mounting a semiconductor chip on the die pad, first ends of each of the leads and first ends of each of the support bars;
    transferring the semiconductor chip to a stage of wire bonding apparatus;
    defining a plurality of inner leads by cutting predetermined cut portions located on each of the leads around the semiconductor chip by light emitted from a laser; and
    bonding wires between each of the inner leads and the semiconductor chip while supporting the semiconductor chip on the die pad by the support bars.

12. The method according to claim 11, wherein said semiconductor chip is mounted on said die pad so that each corner part of said semiconductor chip is supported by a corresponding one of the support bars.

13. The method according to claim 12, wherein the light from the laser is irradiated from a side of the lead frame on which the semiconductor chip is mounted to the leads.

14. The method according to claim 11, wherein all of said leads are cut for forming said inner leads.

15. The method according to claim 11, wherein some of said leads are cut for forming said inner leads.

16. The method according to claim 11, wherein some of said leads are not cut, and said some of the leads and said support bars provide support for the semiconductor chip during said bonding.

17. The method according to claim 16, wherein the light from the laser is irradiated from a side of the lead frame on which the semiconductor chip is mounted to the leads.

18. The method according to claim 11, wherein said inner leads radiate from around said die pad.

19. The method according to claim 18, wherein the light from the laser is irradiated from a side of the lead frame on which the semiconductor chip is mounted to the leads.

20. The method according to claim 11, wherein the light from the laser is irradiated from a side of the lead frame on which the semiconductor chip is mounted to the leads.

* * * * *